(12) United States Patent
Kimura

(10) Patent No.: US 10,672,706 B2
(45) Date of Patent: Jun. 2, 2020

(54) SEMICONDUCTOR DEVICE

(71) Applicant: ABLIC Inc., Chiba-shi, Chiba (JP)

(72) Inventor: Yoshitaka Kimura, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/906,536

(22) Filed: Feb. 27, 2018

(65) Prior Publication Data

US 2018/0261541 A1 Sep. 13, 2018

(30) Foreign Application Priority Data

Mar. 7, 2017 (JP) ................. 2017-043157

(51) Int. Cl.
   *H01L 23/525* (2006.01)
   *H01L 21/768* (2006.01)
   *H01L 23/522* (2006.01)
   *H01L 23/532* (2006.01)

(52) U.S. Cl.
   CPC .... *H01L 23/5258* (2013.01); *H01L 21/76894* (2013.01); *H01L 23/5226* (2013.01); *H01L 23/53238* (2013.01); *H01L 23/53266* (2013.01)

(58) Field of Classification Search
   None
   See application file for complete search history.

(56) References Cited

U.S. PATENT DOCUMENTS 5,625,218 A * 4/1997 Yamadera ........... H01L 23/5256
                                                    257/208
6,867,441 B1 * 3/2005 Yang .................. H01L 23/5258
                                                    257/209

FOREIGN PATENT DOCUMENTS

JP     H09-45782 A    2/1997

* cited by examiner

*Primary Examiner* — Long Pham
(74) *Attorney, Agent, or Firm* — Brinks, Gilson & Lione

(57) ABSTRACT

A semiconductor device includes a multilayer wiring structure on a substrate. The multilayer wiring structure includes: a top wiring; a fuse element, which is located on a lower layer-side of the top wiring, and is made of metal having a melting point that is higher than that of the top wiring; and a lower-layer wiring, which is connected to each of ends of the fuse element. Provided is a semiconductor device in which fuse elements made of the high-melting point metal are arranged at high density.

7 Claims, 10 Drawing Sheets

SEMICONDUCTOR DEVICE

RELATED APPLICATIONS

This application claims priority under 35 U.S.C. § 119 to Japanese Patent Application No. 2017-043157 filed on Mar. 7, 2017, the entire content of which is hereby incorporated by reference.

BACKGROUND OF THE INVENTION

1. Field of the Invention

The present invention relates to a semiconductor device having a multilayer wiring structure.

2. Description of the Related Art

As a conductive material for a fuse element which is blown by a laser beam, polysilicon and aluminum have been widely used. Since the fuse element is generally covered with an insulating film such as a silicon oxide film, cutting of the fuse element by a laser beam becomes hard against the thick insulating film. Thus, in a multilayer wiring process, an aluminum wiring formed at a location near the surface layer of a chip is often used as the fuse element.

Aluminum is easily blown by laser irradiation. However, aluminum is a material having a low melting point and a low boiling point, and hence has a problem in that the debris of aluminum adhere to the vicinity of a blow mark again, causing cutting failure. In view of this problem, there has been proposed a method in which tungsten, which is high-melting point metal, is used as a fuse element (Japanese Patent Application Laid-open No. H 9-45782). Tungsten is a material that is used as a connection via in a multilayer wiring, and hence additional steps for handling different materials are not necessary in forming a fuse element contiguous to the connection via.

In the invention described in Japanese Patent Application Laid-open No. H 9-45782, a top aluminum wiring is used as electrode lead-out portions at both of the ends of the fuse element. The top aluminum wiring is used as a bonding pad in wire bonding and is also used as an input/output path of large current. The top aluminum wiring accordingly has a thickness that is larger than that of a lower-layer aluminum wiring. When the thickness of the aluminum wiring is increased, it is required to increase the width of wiring and the interval of wirings due to subsequent processing-related limitations. Consequently, in this case, the pitch of the top aluminum wirings is larger than the pitch of the lower-layer aluminum wirings. This means that, in the invention described in Japanese Patent Application Laid-open No. H 9-45782, the pitch of the fuse elements is limited by the pitch of the top aluminum wirings, and as a result, the fuse elements cannot be arranged at high density.

SUMMARY OF THE INVENTION

The present invention has been made in view of the circumstances described above, and has an object to provide a semiconductor device in which fuse elements made of high-melting point metal can be arranged at high density.

In order to solve the above-mentioned problem, the present invention adopts the following measures.

(1) According to one embodiment of the present invention, there is provided a semiconductor device including a multilayer wiring structure on a substrate, the multilayer wiring structure including: a top wiring; a fuse element which is located on a lower layer-side of the top wiring, and is made of metal having a melting point that is higher than a melting point of the top wiring; and a lower-layer wiring connected to each of both ends of the fuse element.

(2) According to one or more embodiments, in the semiconductor device as described in Item (1), the lower-layer wiring is connected to each of the both ends on a lower-layer side of the fuse element.

(3) According to one or more embodiments, in the semiconductor device as described in Item (1), the fuse element has a thickness of 200 nm or more and 1,000 nm or less.

(4) According to one or more embodiments, in the semiconductor device as described in Item (1), the lower-layer wiring is connected to each of the both ends of the fuse element through a via.

In the semiconductor device of the present invention, the fuse element is made of the high-melting point metal, and hence when being irradiated with a laser beam, the fuse element is not easily melted. As a result, a problem of droplet adhesion, which causes cutting failure, can be avoided.

In addition, in the semiconductor device of the present invention, the fuse element is not connected to the top wiring but connected to the lower-layer wiring. The thickness of the lower-layer wiring is not limited unlike the top wiring, and hence the lower-layer wiring can be formed to be thin, which enables reductions in width and pitch of the lower-layer wirings. As a result, in the semiconductor device of the present invention, the fuse element pitch as well as the wiring pitch can be reduced, and the fuse elements can therefore be arranged at high density.

DETAILED DESCRIPTION OF THE EMBODIMENTS

Figure 1A:
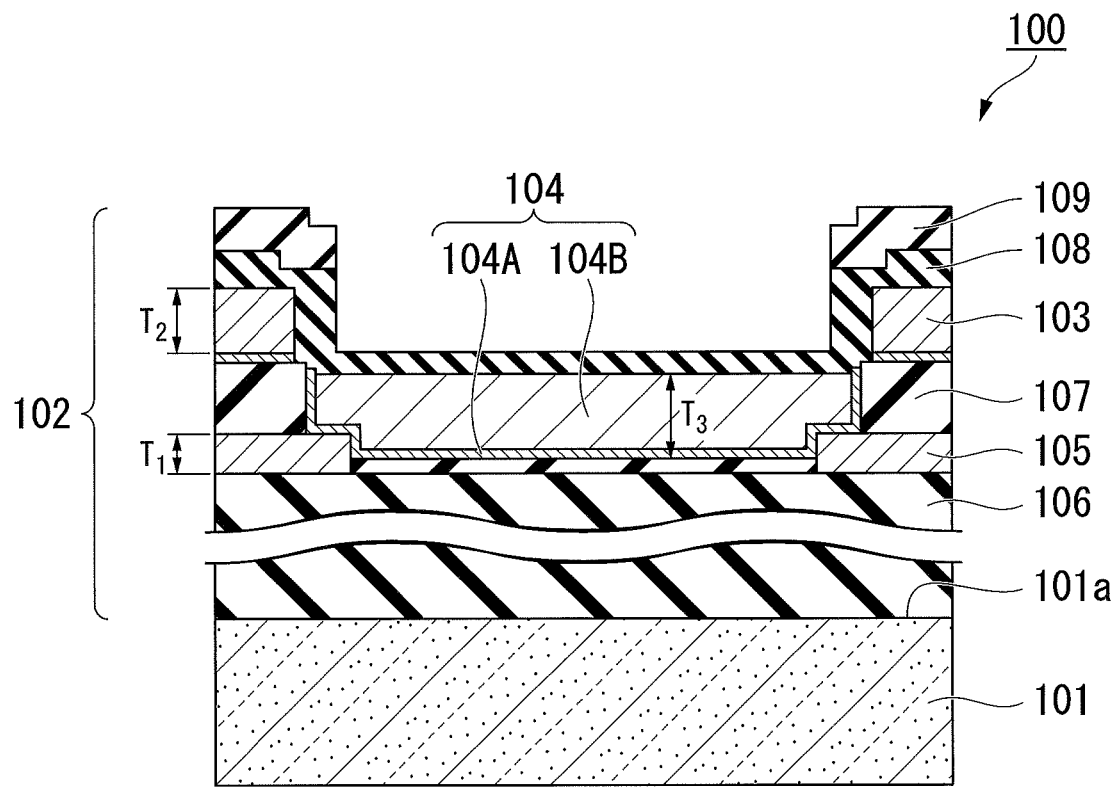
FIG. 1A is a cross-sectional view of a semiconductor device according to a first embodiment of the present invention, which is obtained by cutting the semiconductor device in its laminating direction.

Now, the present invention is described in detail with reference to the drawings as appropriate. In the drawings used in the description below, in order to facilitate understanding of features of the present invention, characteristic parts may be shown in an enlarged manner for convenience of the description, and a dimensional ratio and the like of each component may be different from actual ones. Further, the materials, dimensions, and the like exemplified in the following description are merely examples, and the present invention is not limited thereto. Modifications can be made as appropriate within a range of exerting effects of the present invention.

First Embodiment

[Configuration of Semiconductor Device]

Figure 1B:
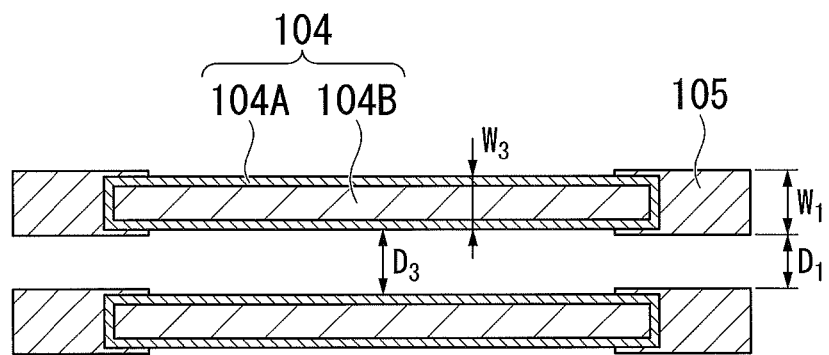
FIG. 1B is a plan view of a fuse element and a wiring connected to the fuse element in the semiconductor device according to the first embodiment of the present invention.

FIG. 1A is a cross-sectional view of a semiconductor device 100 according to a first embodiment of the present invention. FIG. 1B is a plan view of a fuse element 104 and a lower-layer wiring 105 connected to the fuse element 104 in the semiconductor device 100, when viewed from a side (protective film side) opposite to a substrate described later. The semiconductor device 100 includes a multilayer wiring structure 102 including two or more wiring layers on one main surface 101a of a substrate 101 made of silicon and the like.

The multilayer wiring structure 102 at least includes a top wiring 103 made of aluminum, for example, the fuse element 104, which is located on the lower layer-side of the top wiring 103, and is made of metal having a melting point that is higher than that of the top wiring 103, and the lower-layer wiring 105 connected to each of the ends of the fuse element 104. In FIG. 1A, only the configurations around the fuse element 104 are clearly illustrated as a configuration example of the multilayer wiring structure 102. However, the semiconductor device 100 may include other configurations depending on its purpose as a semiconductor device.

In FIG. 1A, as an example of the configuration of the fuse element 104, there is illustrated a laminate structure including a thin portion (barrier metal) 104A formed directly on an interlayer film or the lower-layer wiring 105, and a thick portion 104B formed on the thin portion 104A. The fuse element 104 has a thickness $T_3$, which is preferably 200 nm or more and 1,000 nm or less.

As the configuration of the fuse element 104, the above-mentioned example, an example of a fuse element having another laminate structure, and an example of a fuse element having a single-layer structure are shown in Table 1.

TABLE 1

| Laminate structure | | Material | Formation method |
|---|---|---|---|
| Ti/TiN/W | Thick portion | W (tungsten) | CVD |
| | Thin portion | TiN (titanium nitride) | Reactive sputtering or CVD |
| | | Ti (titanium) | Sputtering |
| Ti/TiN | Thick portion | TiN (titanium nitride) | Reactive sputtering or CVD |
| | Thin portion | Ti (titanium) | Sputtering |
| TiN | Thick portion | TiN (titanium nitride) | Reactive sputtering or CVD |
| TaN/Cu | Thick portion | Cu (copper) | Plating |
| | | Cu (copper) seed | Sputtering |
| | Thin portion | TaN (tantalum nitride) | Reactive sputtering or CVD |
| Ta/Cu | Thick portion | Cu (copper) | Plating |
| | | Cu (copper) seed | Sputtering |
| | Thin portion | Ta (tantalum) | |
| Ta/TaN/Cu | Thick portion | Cu (copper) | Plating |
| | | Cu (copper) seed | Sputtering |
| | Thin portion | TaN (tantalum nitride) | Reactive sputtering or CVD |
| | | Ta (tantalum) | Sputtering |
| Ta/TaN | Thick portion | TaN (tantalum nitride) | Reactive sputtering or CVD |
| | Thin portion | Ta (tantalum) | Sputtering |
| TaN | Thick portion | TaN (tantalum nitride) | Reactive sputtering or CVD |
| Ta | Thick portion | Ta (tantalum) | Sputtering |

Since tungsten is also a material of via for connecting wirings in respective layers to each other, use of tungsten enables continual manufacturing of the fuse element 104 and the via, and preferably the manufacturing process can be simplified.

Interlayer insulating films are formed between the layers constructing the multilayer wiring structure 102, and between the layers and the substrate 101. As the interlayer insulating film, an oxide film made of $SiO_2$ or tetraethyl orthosilicate (TEOS ($Si(OC_2H_5)_4$)) or other various films are used depending on a purpose. For the sake of convenience of description of a manufacturing method, which is made later, among the plurality of interlayer insulating films, the interlayer insulating film formed between the substrate 101 and the lower-layer wiring 105 is herein referred to as "interlayer insulating film 106", and the interlayer insulating film formed between the lower-layer wiring 105 and the top wiring 103 is herein referred to as "interlayer insulating film 107".

On the upper layer-side of the top wiring 103, a first protective film 108 made of an oxide, for example, $SiO_2$, and a second protective film 109 made of a nitride, for example, SiN, are formed in the stated order. Both of the protective films have a function of preventing invasion of particles from outside the semiconductor device 100, for example. The first protective film 108 has steps and thus also has a function of relaxing stress that is applied on the top wiring 103 from the second protective film 109. The upper layer of the top wiring 103 as used herein means a layer that is formed after the top wiring 103 in the manufacturing process.

On the upper layer-side of the fuse element 104, only the first protective film 108 is formed. A portion of the first protective film 108 that is formed on the fuse element 104 preferably has a thickness of 100 nm or more so as to serve as a protective film. Further, the portion of the first protective film 108 that is formed on the fuse element 104 preferably has a thickness of 1,000 nm or less so as not to prevent the cutting of the fuse element 104 by laser irradiation.

Further, in order to achieve the thin first protective film 108 on the fuse element 104, the fuse element 104 is preferably formed at a location near the outermost surface of the semiconductor device 100. Thus, the lower-layer wiring 105 connected to the ends of the fuse element 104 is preferably a wiring forming a layer closest to the outermost surface next to the top wiring 103, and is more preferably a wiring forming a layer just below the top wiring 103.

The lower-layer wiring 105 is not used in bonding, and hence a thickness $T_1$ of the lower-layer wiring 105 can be reduced. In this case, under the consideration of the limitations on a design rule, a width $W_1$ of the lower-layer wiring 105 in plan view (FIG. 1B), in which the lower-layer wiring 105 is viewed from the protective film side, can also be reduced at approximately the same ratio. Specifically, for example, when the thickness $T_1$ of the lower-layer wiring 105 is reduced to about 30% of a thickness $T_2$ of the top wiring 103, the width $W_1$ can also be reduced to about 30% of the thickness $T_2$. Further, a distance (pitch) $D_1$ between adjacent lower-layer wirings 105 can be reduced by a reduced amount of the width $W_1$. This means that a distance (pitch) $D_3$ between adjacent fuse elements 104 connected to the lower-layer wirings 105 can be reduced. As a result, a plurality of fuse elements 104 can be arranged at high density.

A width $W_3$ of the fuse element 104 is preferably 200 nm or more and 600 nm or less, and the width $W_1$ of the lower-layer wiring 105 is preferably at least 100% or more of the width $W_3$ of the fuse element 104.

As described above, in the semiconductor device 100 according to the first embodiment, the fuse element 104 is made of high-melting point metal, and hence when being irradiated with a laser beam, the fuse element 104 is not easily melted. As a result, a problem of droplet adhesion, which causes cutting failure, can be avoided.

In addition, in the semiconductor device 100 according to the first embodiment, the fuse element 104 is not connected to the top wiring 103 but connected to the lower-layer wiring 105, which is located below the top wiring 103. The thickness of the lower-layer wiring 105 is not limited unlike the top wiring 103, and hence the lower-layer wiring 105 can be formed to be thin, which enables reductions in width and pitch of the lower-layer wirings 105. As a result, in the semiconductor device 100 according to the first embodiment, the fuse element pitch as well as the wiring pitch can be reduced, and the fuse elements 104 can therefore be arranged at high density.

[Method of Manufacturing Semiconductor Device]

A method of manufacturing the semiconductor device 100 is described with reference to FIG. 2A to FIG. 2D and FIG. 3A to FIG. 3D. Specifically, steps of forming the fuse element 104 and its surroundings are mainly described.

Figure 2A:
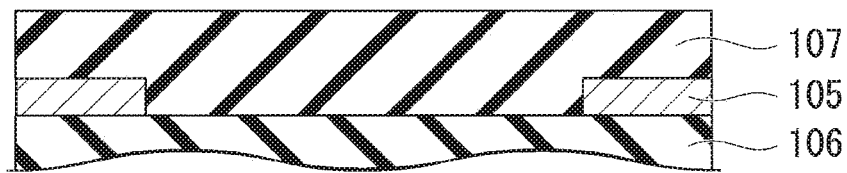
FIG. 2A, FIG. 2B, FIG. 2C, and FIG. 2D are views of a flow including main steps, for illustrating a method of manufacturing the semiconductor device according to the first embodiment of the present invention.

As illustrated in FIG. 2A, in forming the laminate structure on one main surface side of the substrate made of silicon, for example, the wiring (lower-layer wiring) 105 to be connected to the ends of the fuse element 104 is formed on the interlayer insulating film 106, which forms a layer below the first protective film 108 by three layers or more. In FIG. 2A, the substrate, which is not shown, is arranged below the interlayer insulating film 106.

Subsequently, the interlayer insulating film 107 which is an interlayer insulating film different from the interlayer insulating film 106 is formed on the interlayer insulating film 106 and the lower-layer wiring 105. The lower-layer wiring 105, the interlayer insulating films 106 and 107, wirings and interlayer films forming lower layers of those components can be formed by appropriately repeating film formation by a CVD method, a sputtering method, or other known methods and patterning of the films by a photolithography method.

Figure 2B:
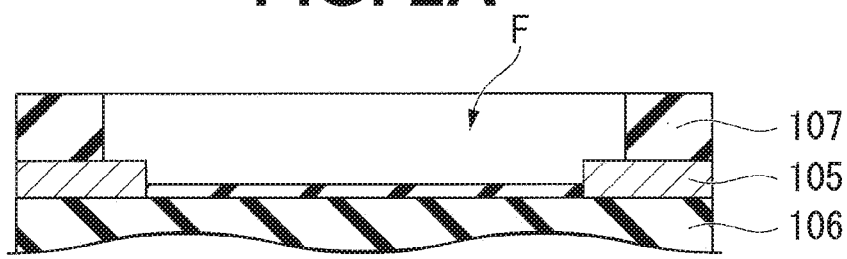

Next, as illustrated in FIG. 2B, a portion F of the interlayer insulating film 107, in which the fuse element 104 is to be formed, is removed by an etching method, and the lower-layer wiring 105 is partially exposed.

Figure 2C:
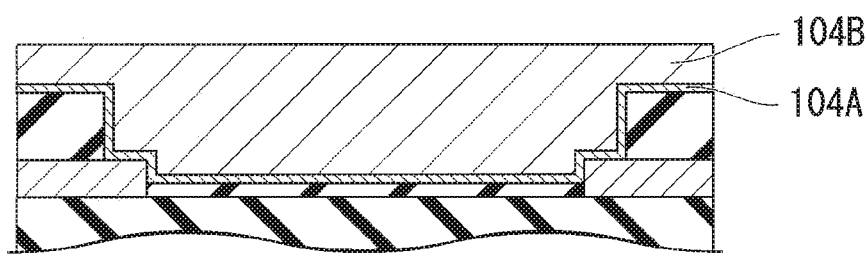

Next, as illustrated in FIG. 2C, films corresponding to the thin portion (barrier metal) 104A and the thick portion 104B, which form the fuse element 104, are formed in the stated order so as to cover the entire surface that includes the exposed surface and is opposite to the substrate. The film corresponding to the thin portion 104A is formed to have a thickness in a range of a few nanometers (nm) or more and 100 nm or less although the thickness may varies depending on a process to be used. The film corresponding to the thick portion 104B is formed to be thick enough so that the outermost surface becomes flush.

As combinations of materials and formation methods for the respective films, for example, the combinations shown in Table 1 can be given. The method of forming the fuse element 104 in the laminate structure is exemplified so far. A method of forming the fuse element in a single-layer structure differs from the above-mentioned method in that the film corresponding to the thin portion 104A is not formed.

Figure 2D:
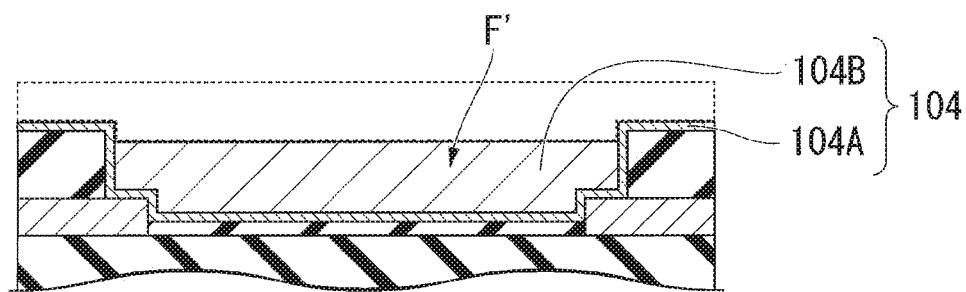

Next, as illustrated in FIG. 2D, a portion of the film corresponding to the thick portion 104B (a portion surrounded by the broken line) that expands over a portion F', in which the fuse element 104 is to be formed, is removed by a dry etching method or a CMP method. At this point, the fuse element 104 is complete.

Figure 3A:
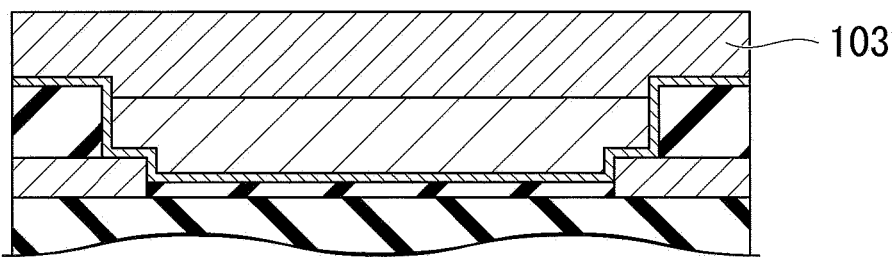
FIG. 3A, FIG. 3B, FIG. 3C, and FIG. 3D are views of a flow including main steps, for illustrating the method of manufacturing the semiconductor device according to the first embodiment of the present invention.

Next, as illustrated in FIG. 3A, a film corresponding to the top wiring 103 is formed by the CVD method or the sputtering method so as to cover the entire surface opposite to the substrate. This film is formed to have a thickness that allows the film to be used as a bonding pad in wire bonding and an input/output path of large current.

Figure 3B:
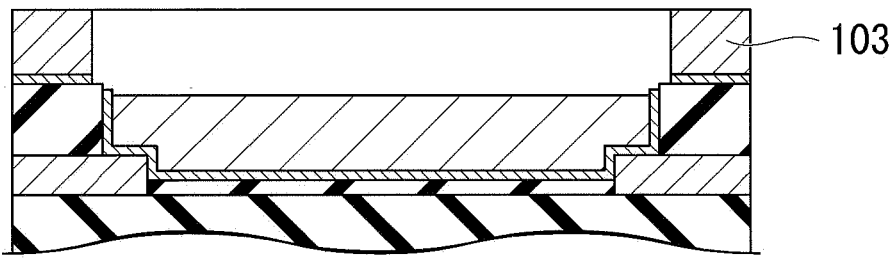

Next, as illustrated in FIG. 3B, the top wiring 103 is patterned into a desired shape with use of the photolithography method and the etching method.

Figure 3C:
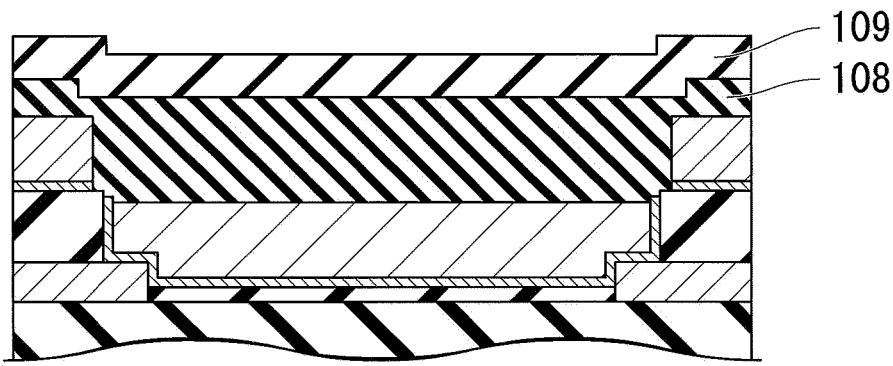

Next, as illustrated in FIG. 3C, the first protective film (oxide film) 108 and the second protective film (nitride film) 109 are formed in the stated order with use of the CVD method so as to cover the entire surface that includes the exposed surface and is opposite to the substrate.

Figure 3D:
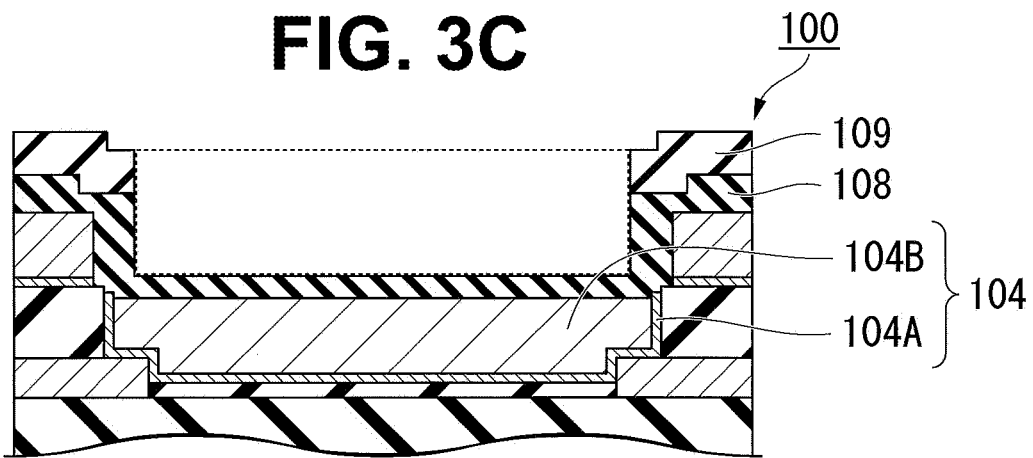

Next, as illustrated in FIG. 3D, an unnecessary portion of the first protective film 108 and an unnecessary portion of the second protective film 109 on the fuse element 104 (a portion surrounded by the broken line) are removed so that only the first protective film 108 having a desired thickness remains on the fuse element 104. The desired thickness as used herein means a thickness that achieves the function as the protective film, but does not prevent the cutting of the fuse element 104 by laser irradiation.

Through the procedure described above, the semiconductor device 100 can be obtained. According to this procedure, the groove in which the fuse element 104 is to be formed and the via for connection to the lower-layer wiring 105 are simultaneously formed. The manufacturing process can thus be simplified, leading to a cost reduction.

Comparative Example

Figure 4A:
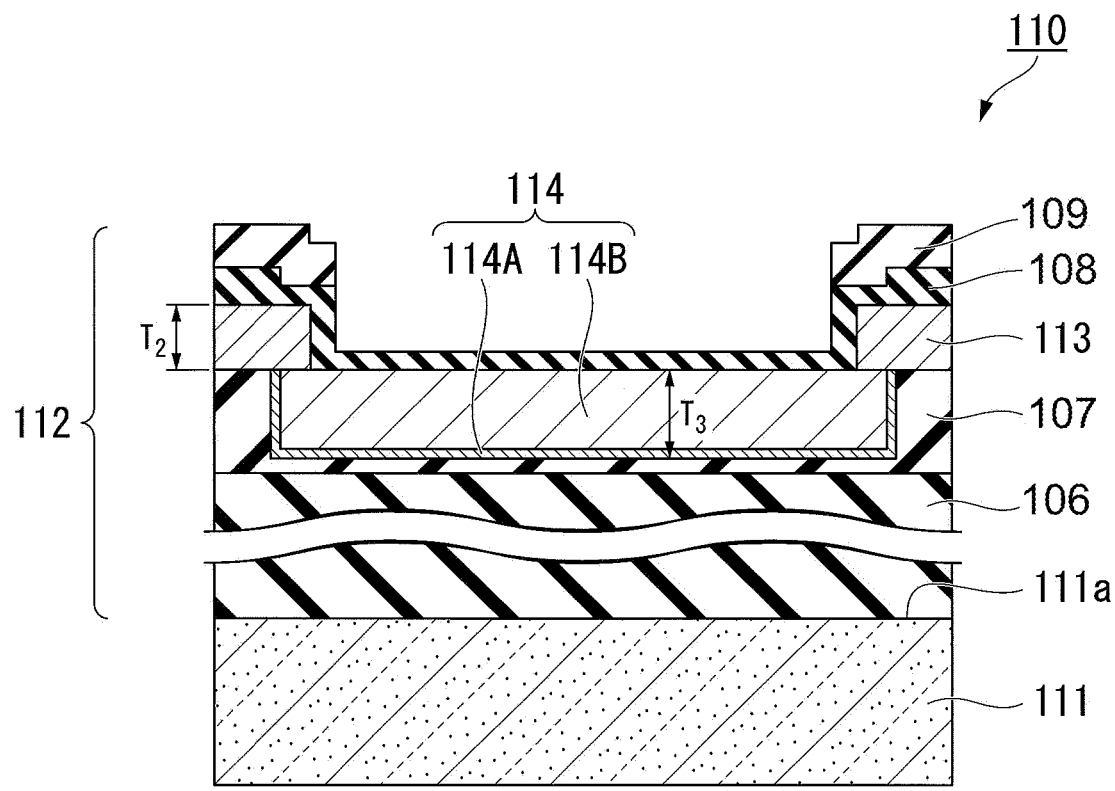
FIG. 4A is a cross-sectional view of a semiconductor device according to the related art, which is obtained by cutting the semiconductor device in its laminating direction.
Figure 4B:
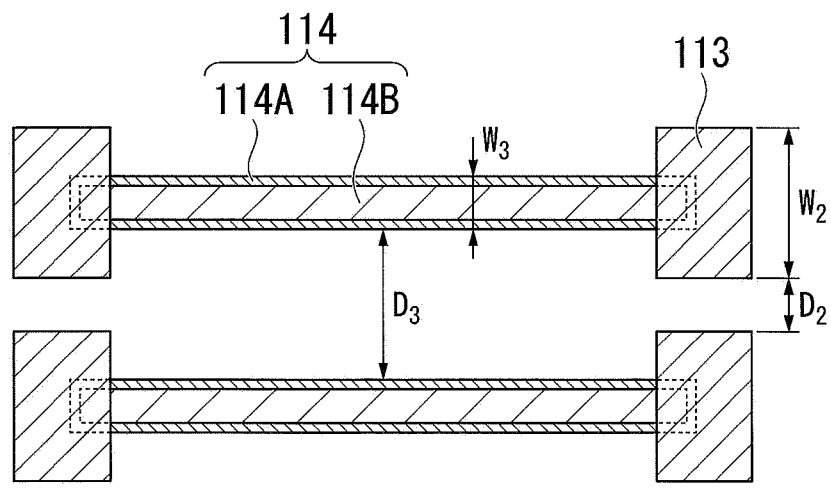
FIG. 4B is a plan view of a fuse element and a wiring connected to the fuse element in the semiconductor device according to the related art.

As a comparative example of the first embodiment, a semiconductor device 110 according to the related art is described with reference to FIG. 4A and FIG. 4B. FIG. 4A is a cross-sectional view of the semiconductor device 110. FIG. 4B is a plan view of a fuse element 114 and a top wiring 113 connected to the fuse element 114 in the semiconductor device 110, when viewed from a side (protective film side) opposite to a substrate described later. The semiconductor device 110 includes a multilayer wiring structure 112 including two or more wiring layers on one main surface 111a of a substrate 111 made of silicon and the like. The semiconductor device 110 according to the related art differs from the semiconductor device 100 of the first embodiment in that each of the ends of the fuse element 114 is not connected to a lower-layer wiring but connected to the top wiring 113. The fuse element 114 has a laminate structure including a thin portion 114A disposed as a barrier metal and a thick portion 104B formed on the thin portion 114A. The remaining configurations of the semiconductor device 110 are the same as those of the semiconductor device 100.

The top wiring 113 is used as a bonding pad in wire bonding and is also used as an input/output path of large current. The top wiring 113 is accordingly required to have a thickness $T_2$ that is larger than that of the lower-layer wiring. When the thickness $T_2$ of the top wiring 113 is increased, a width $W_2$ of the top wiring 113 should be increased due to subsequent processing-related limitations. A distance $D_2$ between the adjacent top wirings 113 should also be secured. Consequently, in the semiconductor device 110 according to the related art, an increase in pitch of the fuse elements 114 is unavoidable, and hence it is difficult to arrange the fuse elements 114 at high density.

Second Embodiment

[Configuration of Semiconductor Device]

Figure 5:
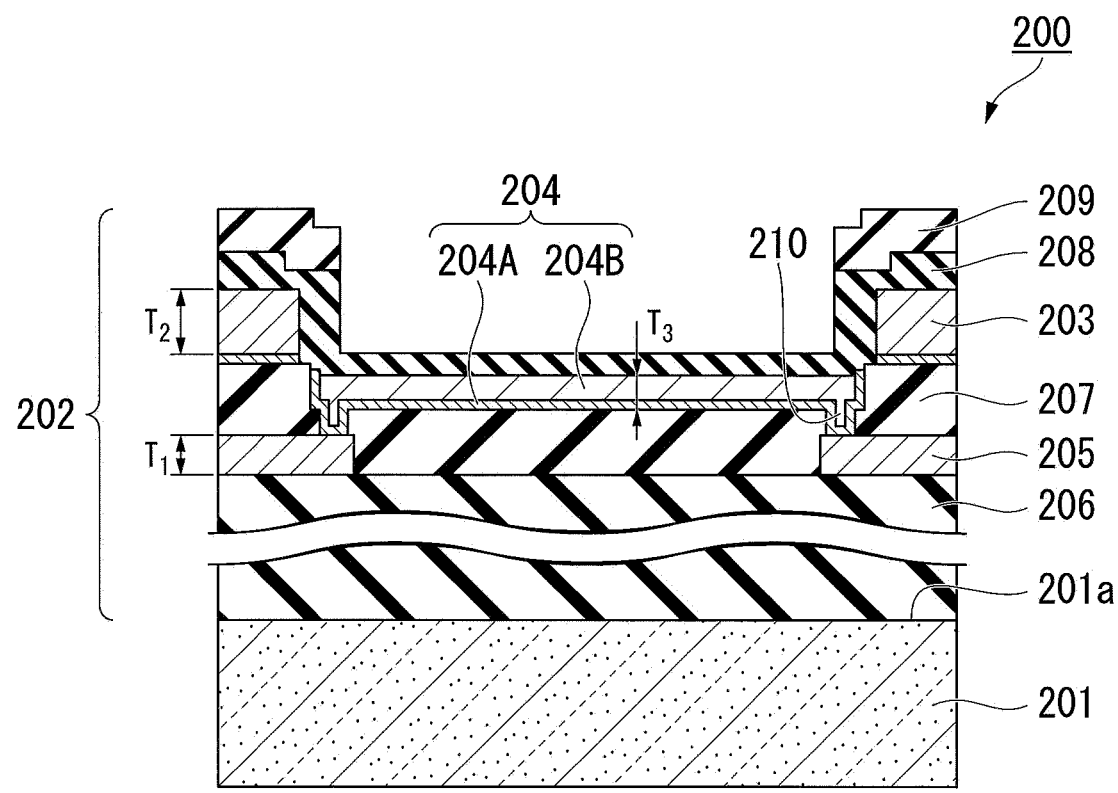
FIG. 5 is a cross-sectional view of a semiconductor device according to a second embodiment of the present invention, which is obtained by cutting the semiconductor device in its laminating direction.

FIG. 5 is a cross-sectional view of a semiconductor device 200 according to a second embodiment of the present invention. The semiconductor device 200 includes a multilayer wiring structure 202 including two or more wiring layers on one main surface 201a of a substrate 201 made of silicon and the like. In the semiconductor device 200 a lower-layer wiring 205 is connected to each of the ends of a fuse element 204 through a via 210, which differs from the semiconductor device 100 according to the first embodiment in which the lower-layer wiring 105 is directly connected to the fuse element 104. The remaining configurations of the semiconductor device 200 are the same as those of the semiconductor device 100, and the same effects as those of the semiconductor device 100 can be obtained.

[Method of Manufacturing Semiconductor Device]

A method of manufacturing the semiconductor device 200 is described with reference to FIG. 6A to FIG. 6E and FIG. 7A to FIG. 7D. Specifically, steps of forming the fuse element 204 and its surroundings are mainly described.

Figure 6A:
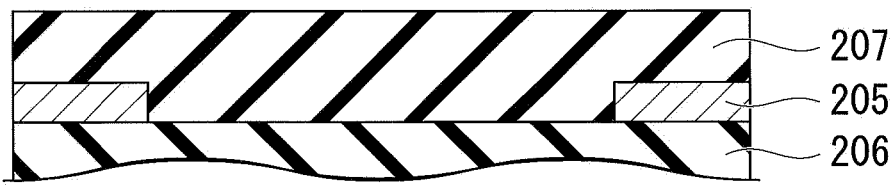
FIG. 6A, FIG. 6B, FIG. 6C, FIG. 6D, and FIG. 6E are views of a flow including main steps, for illustrating a method of manufacturing the semiconductor device according to the second embodiment of the present invention.

As illustrated in FIG. 6A, in forming the laminate structure on one main surface side of the substrate made of silicon and the like, the wiring (lower-layer wiring) 205 to which the both ends of the fuse element 204 are connected is formed on an interlayer insulating film 206, which forms a layer below the first protective film 208 by three layers or more. In FIG. 6A, the substrate, which is not shown, is arranged below the interlayer insulating film 206.

Subsequently, an interlayer insulating film 207 which is an interlayer insulating film different from the interlayer insulating film 206 is formed on the interlayer insulating film 206 and the lower-layer wiring 205. The lower-layer wiring 205, the interlayer insulating films 206 and 207, wirings and interlayer films forming lower layers of those components can be formed by appropriately repeating film formation by the CVD method, the sputtering method, or other known methods and patterning of the films by the photolithography method.

Figure 6B:
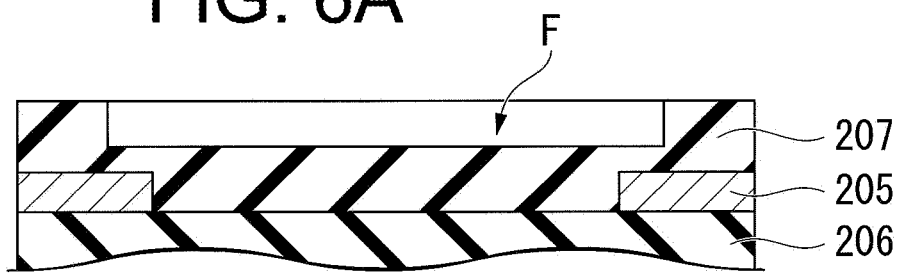

Next, as illustrated in FIG. 6B, a portion F of the interlayer insulating film 207, in which the fuse element 204 is to be formed, is removed by the etching method.

Figure 6C:
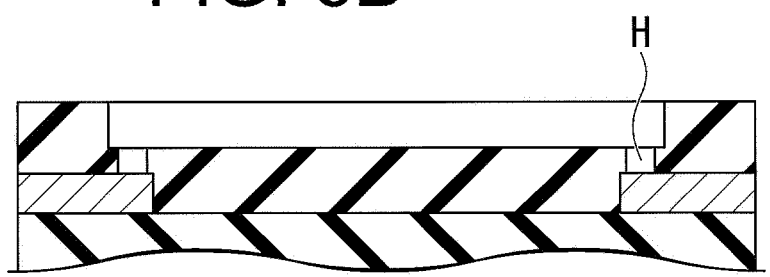

Next, as illustrated in FIG. 6C, through holes H for partially exposing the lower-layer wiring 205 are formed with use of the photolithography method and the etching method.

Figure 6D:
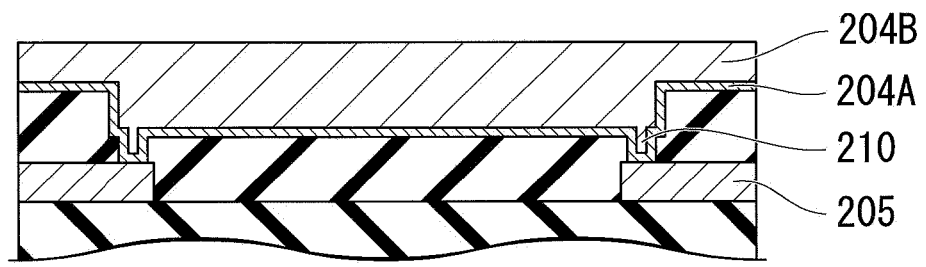

Next, as illustrated in FIG. 6D, films corresponding to a thin portion (barrier metal) 204A and a thick portion 204B, which form the fuse element 204, are formed in the stated order so as to cover the entire surface that is opposite to the substrate. The film corresponding to the thin portion 204A is formed to have a thickness in a range of a few nanometers (nm) or more and 100 nm or less although the thickness may varies depending on a process to be used. The film corresponding to the thick portion 204B is formed to be thick enough so that the outermost surface becomes flush. At this point, the vias 210 for connecting the lower-layer wiring 205 and the fuse element 204 to each other are complete.

As combinations of materials and formation methods for the respective films, for example, the combinations shown in Table 1 can be given. The method of forming the fuse element 204 in the laminate structure is exemplified so far. A method of forming the fuse element in a single-layer structure differs from the above-mentioned method in that the film corresponding to the thin portion 204A is not formed.

Figure 6E:
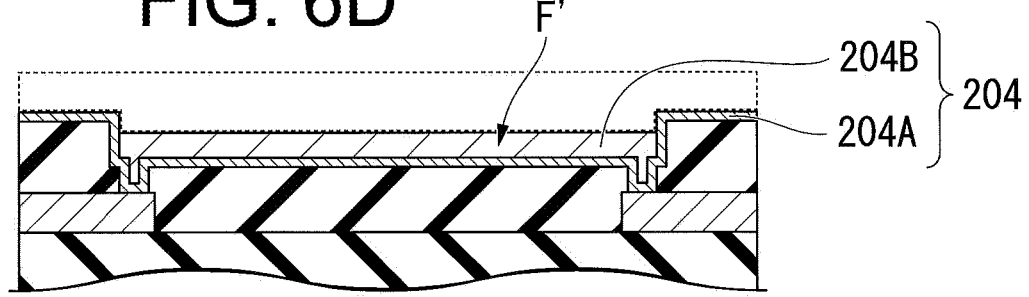

Next, as illustrated in FIG. 6E, a portion of the film corresponding to the thick portion 204B (a portion surrounded by the broken line) that expands over a portion F', in which the fuse element 204 is to be formed, is removed by the dry etching method or the CMP method. At this point, the fuse element 204 is complete.

Figure 7A:
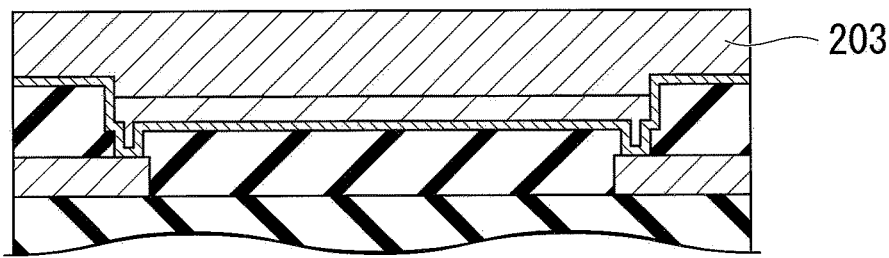
FIG. 7A, FIG. 7B, FIG. 7C, and FIG. 7D are views of a flow including main steps, for illustrating the method of manufacturing the semiconductor device according to the second embodiment of the present invention.

Next, as illustrated in FIG. 7A, a film corresponding to a top wiring 203 is formed by the CVD method or the sputtering method so as to cover the entire surface opposite to the substrate. This film is formed to have a thickness that allows the film to be used as a bonding pad in wire bonding and an input/output path of large current.

Figure 7B:
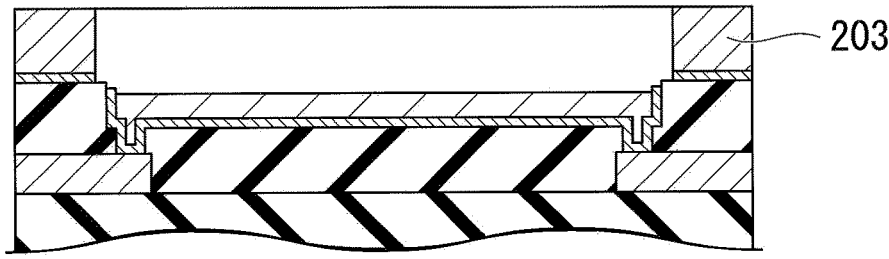

Next, as illustrated in FIG. 7B, the top wiring 203 is patterned into a desired shape with use of the photolithography method and the etching method.

Figure 7C:
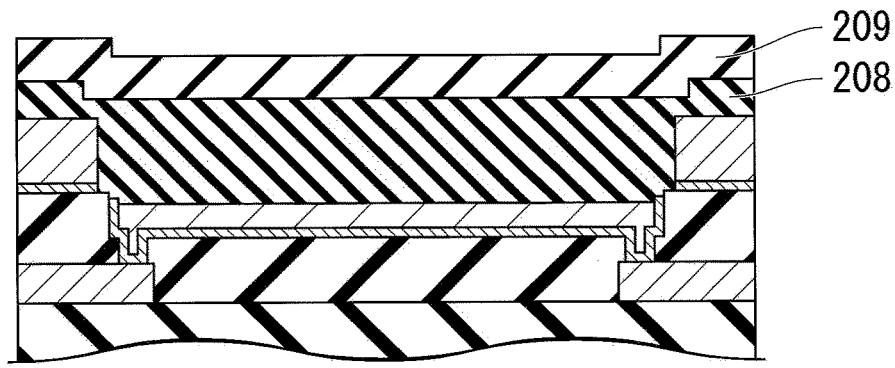

Next, as illustrated in FIG. 7C, the first protective film (oxide film) 208 and a second protective film (nitride film) 209 are formed in the stated order with use of the CVD method so as to cover the entire surface that is opposite to the substrate.

Figure 7D:
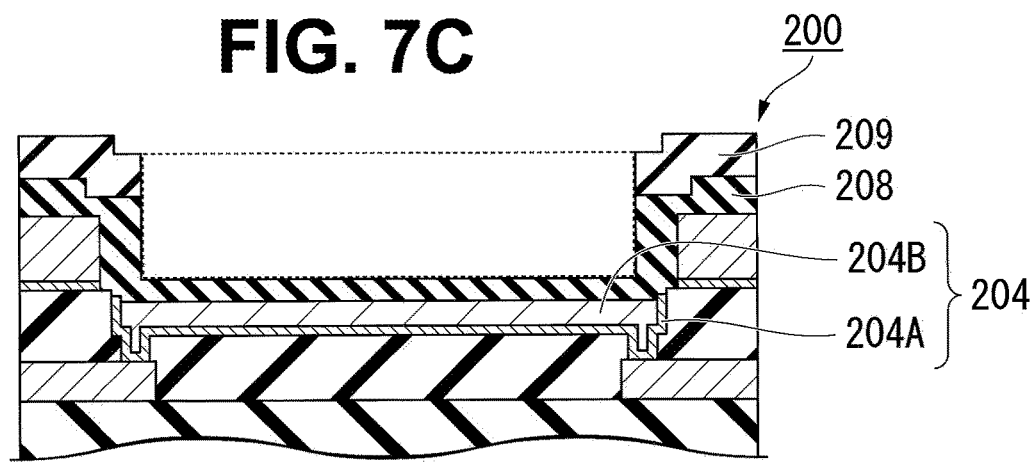

Next, as illustrated in FIG. 7D, an unnecessary portion of the first protective film 208 and an unnecessary portion of the second protective film 209 on the fuse element 204 (a portion surrounded by the broken line) are removed so that only the first protective film 208 having a desired thickness remains on the fuse element 204. The desired thickness as used herein means a thickness that achieves the function as the protective film, but does not prevent the cutting of the fuse element 204 by laser irradiation.

Through the procedure described above, the semiconductor device 200 can be obtained. According to this procedure, the groove in which the fuse element 204 is to be formed and the via for connection to the lower-layer wiring 205 are separately formed. This means that the fuse element 204 can have any thickness, and hence the fuse element 204 can be formed to be thin so that the fuse element 204 can be more easily blown by a laser beam.

Third Embodiment

[Configuration of Semiconductor Device]

Figure 8:
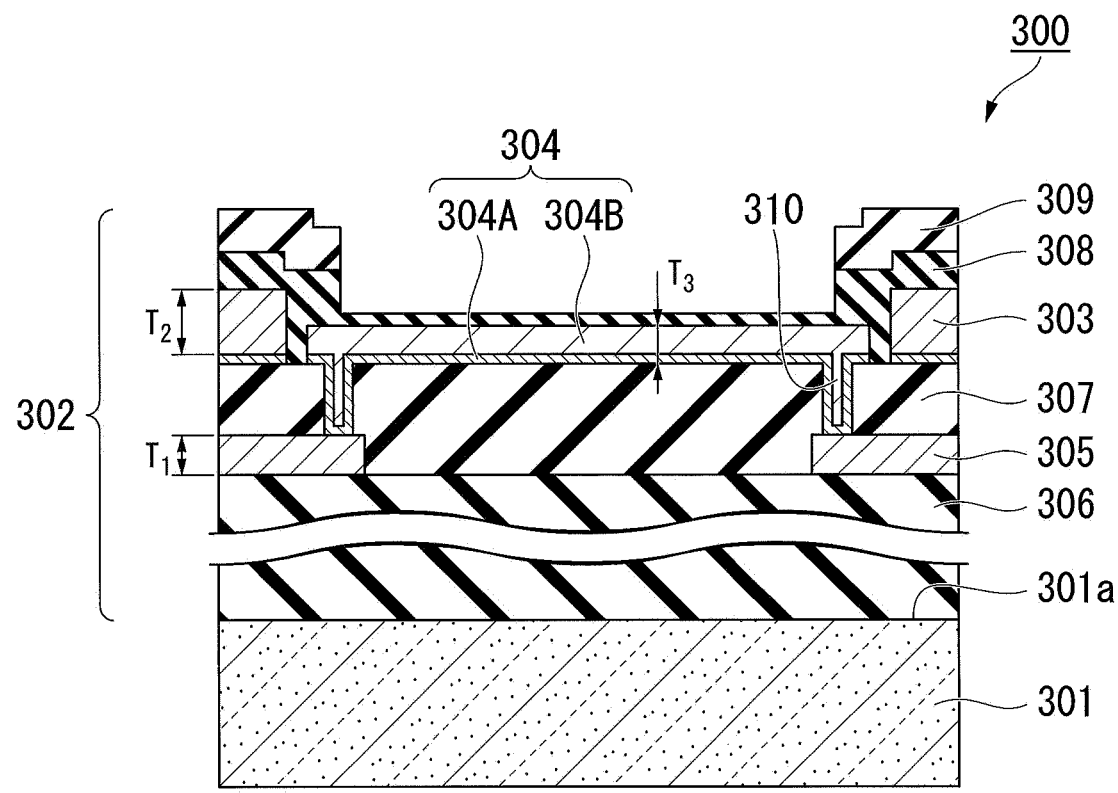
FIG. 8 is a cross-sectional view of a semiconductor device according to a third embodiment of the present invention, which is obtained by cutting the semiconductor device in its laminating direction.

FIG. 8 is a cross-sectional view of a semiconductor device 300 according to a third embodiment of the present invention. The semiconductor device 300 includes a multilayer wiring structure 302 including two or more wiring layers on one main surface 301a of a substrate 301 made of silicon and the like. In the semiconductor device 300 a fuse element 304 is formed on an interlayer insulating film 307 located between a top wiring 303 and a lower-layer wiring 305, which differs from the semiconductor device 200 according to the second embodiment in which the fuse element 204 is formed in the interlayer insulating film 207 located between the top wiring 203 and the lower-layer wiring 205. The remaining configurations of the semiconductor device 300 are the same as those of the semiconductor device 200, and the same effects as those of the semiconductor device 200 can be obtained.

[Method of Manufacturing Semiconductor Device]

A method of manufacturing the semiconductor device 300 is described with reference to FIG. 9A to FIG. 9E and FIG. 10A to FIG. 10D. Specifically, steps of forming the fuse element 304 and its surroundings are mainly described.

Figure 9A:
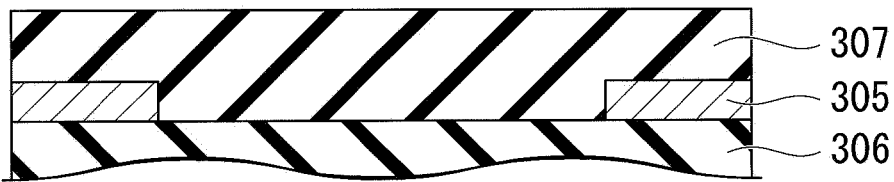
FIG. 9A, FIG. 9B, FIG. 9C, and FIG. 9D are views of a flow including main steps, for illustrating a method of manufacturing the semiconductor device according to the third embodiment of the present invention.

As illustrated in FIG. 9A, in forming the laminate structure on one main surface side of the substrate made of silicon, for example, the wiring (lower-layer wiring) 305 to which the both ends of the fuse element 304 are connected is formed on an interlayer insulating film 306, which forms a layer below the first protective film 308 by three layers or more. In FIG. 9A, the substrate, which is not shown, is arranged below the interlayer insulating film 306.

Subsequently, the interlayer insulating film 307 which is an interlayer insulating film different from the interlayer insulating film 306 is formed on the interlayer insulating film 306 and the lower-layer wiring 305. The lower-layer wiring 305, the interlayer insulating films 306 and 307, wirings and interlayer films forming lower layers of those components can be formed by appropriately repeating film formation by the CVD method, the sputtering method, or other known methods and patterning of the films by the photolithography method.

Figure 9B:
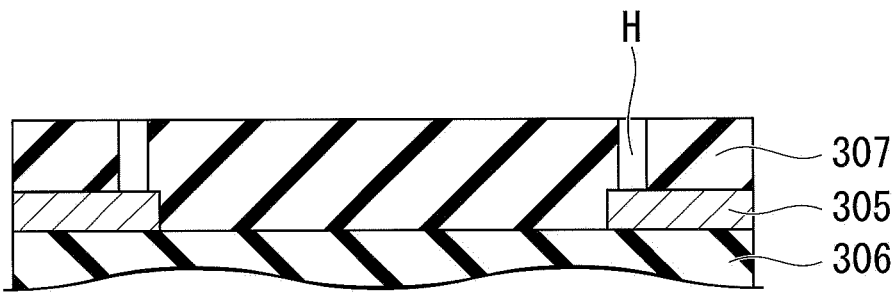

Next, as illustrated in FIG. 9B, through holes H for partially exposing the lower-layer wiring 305 are formed with use of the photolithography method and the etching method.

Figure 9C:
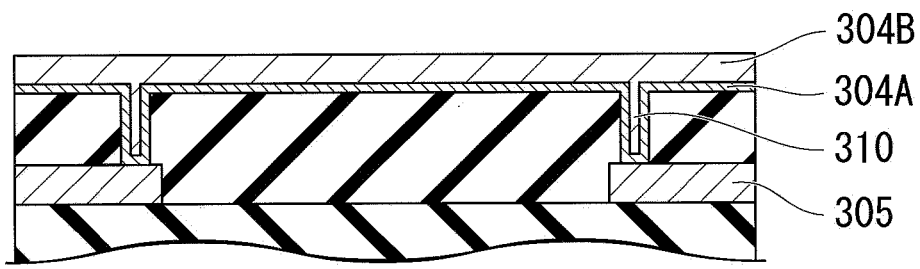

Next, as illustrated in FIG. 9C, films corresponding to a thin portion (barrier metal) 304A and a thick portion 304B, which form the fuse element 304, are formed in the stated order so as to cover the entire surface that is opposite to the substrate. The film corresponding to the thin portion 304A is formed to have a thickness in a range of a few nanometers (nm) or more and 100 nm or less although the thickness may varies depending on a process to be used. The film corresponding to the thick portion 304B is formed to be thick enough so that the outermost surface becomes flush. At this point, vias 310 for connecting the lower-layer wiring 305 and the fuse element 304 to each other are complete.

As combinations of materials and formation methods for the respective films, for example, the combinations shown in Table 1 can be given. The method of forming the fuse element 304 in the laminate structure is exemplified so far. A method of forming the fuse element in a single-layer structure differs from the above-mentioned method in that the film corresponding to the thin portion 304A is not formed.

Figure 9D:
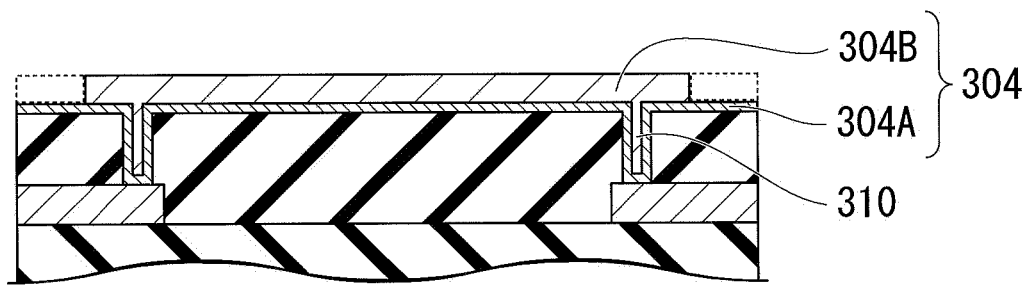

Next, as illustrated in FIG. 9D, a region of the film corresponding to the thick portion 304B (a region surrounded by the broken line), in which the fuse element 304 is not to be formed, is removed by the photolithography method or the etching method. At this point, the fuse element 304 is complete.

Figure 10A:
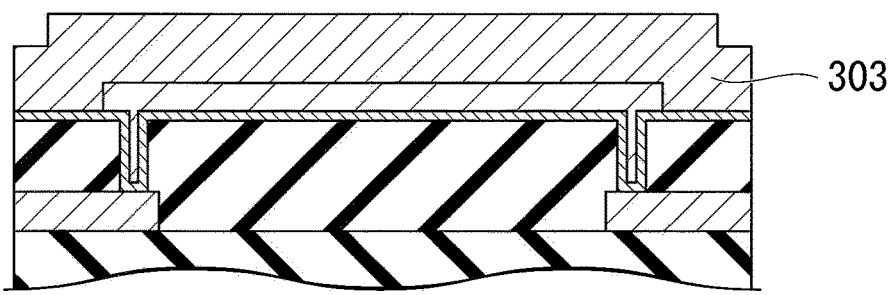
FIG. 10A, FIG. 10B, FIG. 10C, and FIG. 10D are views of a flow including main steps, for illustrating the method of manufacturing the semiconductor device according to the third embodiment of the present invention.

Next, as illustrated in FIG. 10A, a film corresponding to the top wiring 303 is formed by the CVD method or the sputtering method so as to cover the entire surface opposite to the substrate. This film is formed to have a thickness that allows the film to be used as a bonding pad in wire bonding and an input/output path of large current.

Figure 10B:
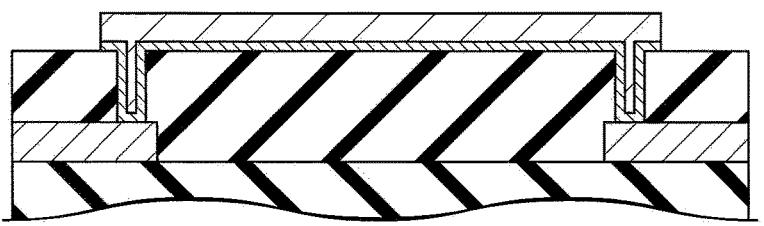

Next, as illustrated in FIG. 10B, the top wiring 303 is patterned into a desired shape with use of the photolithography method and the etching method.

Figure 10C:
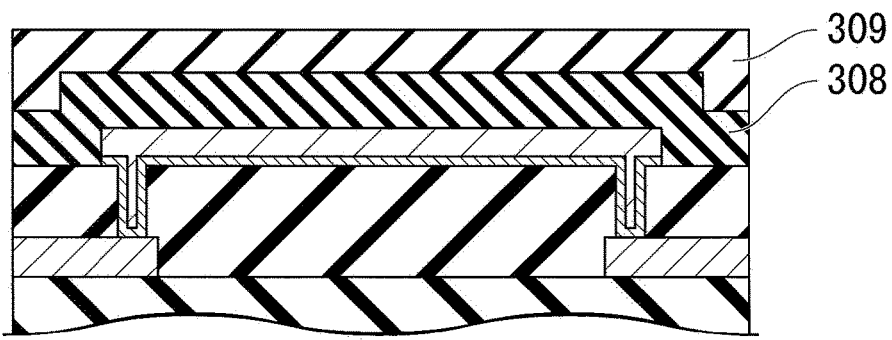

Next, as illustrated in FIG. 10C, the first protective film (oxide film) 308 and a second protective film (nitride film) 309 are formed in the stated order with use of the CVD method so as to cover the entire surface that includes the exposed surface of a groove portion and is opposite to the substrate.

Figure 10D:
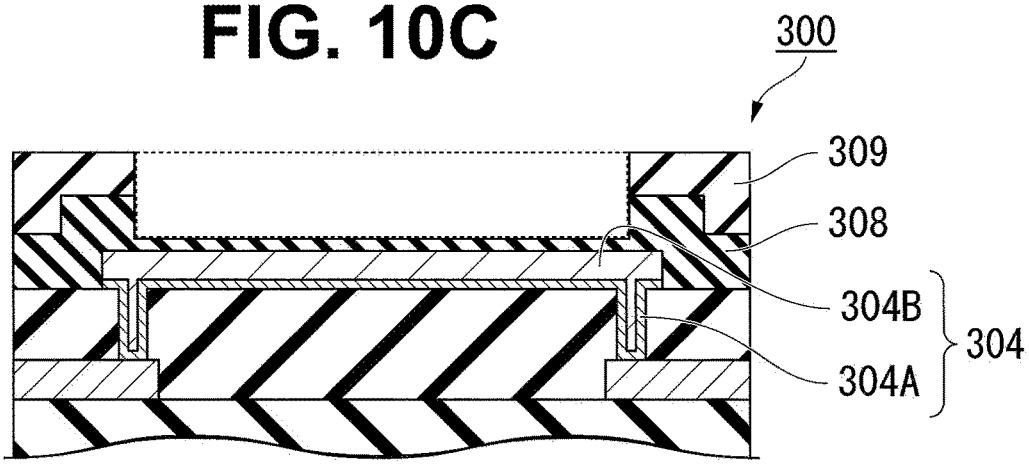

Next, as illustrated in FIG. 10D, an unnecessary portion of the first protective film 308 and an unnecessary portion of the second protective film 309 on the fuse element 304 (a portion surrounded by the broken line) are removed so that only the first protective film 308 having a desired thickness remains on the fuse element 304. The desired thickness as used herein means a thickness that achieves the function as the protective film, but does not prevent the cutting of the fuse element 304 by laser irradiation.

Through the procedure described above, the semiconductor device 300 can be obtained. According to this procedure, when the vias 310 for connection to the lower-layer wiring 305 are filled with tungsten by CVD, the fuse element 304 having a desired thickness can be formed as follows: only a portion in which the fuse element 304 is formed later is covered with resist, and the tungsten is etched back. The thickness of the tungsten in this case is mainly determined by a thickness provided by CVD, and hence can be made smaller than a thickness that is formed through the procedure of the first embodiment.

What is claimed is:

1. A semiconductor device, comprising:
   a substrate; and
   a multilayer wiring structure on the substrate,
   the multilayer wiring structure comprising:
      a top wiring;
      a fuse element located on a lower-layer side of the top wiring, the fuse element comprising a first layer of a first metal and a second layer of a second metal disposed directly on top of the first layer, the second layer being thicker than the first layer, the first metal and the second metal having a melting point that is higher than a melting point of the top wiring; and
      a lower-layer wiring connected to each of both ends of the first layer of the fuse element.

2. The semiconductor device according to claim 1, wherein the lower-layer wiring is connected directly to each of the both ends from a lower-layer side of the fuse element.

3. The semiconductor device according to claim 1, wherein the fuse element has a thickness of 200 nm or more and 1,000 nm or less.

4. The semiconductor device according to claim 2, wherein the fuse element has a thickness of 200 nm or more and 1,000 nm or less.

5. The semiconductor device according to claim 1, wherein the lower-layer wiring is connected to each of the both ends of the fuse element through a via.

6. The semiconductor device according to claim 3, wherein the lower-layer wiring is connected to each of the both ends of the fuse element through a via.

7. A semiconductor device, comprising:
   a substrate; and
   a multilayer wiring structure on the substrate,
   the multilayer wiring structure comprising:
      a top wiring;
      a fuse element made from the top wiring, the fuse element comprising a first layer of a first metal and a second layer of a second metal disposed directly on top of the first layer, the second layer being thicker than the first layer, the first metal and the second metal having a melting point that is higher than a melting point of the top wiring; and
      a lower-layer wiring connected to each of both ends of the first layer of the fuse element through a via.

* * * * *